(12) United States Patent
Burdick

(10) Patent No.: US 6,547,572 B1
(45) Date of Patent: Apr. 15, 2003

(54) INTEGRATED AND FLEXIBLE POWER DISTRIBUTION ASSEMBLY

(75) Inventor: Robert C. Burdick, Romulus, MI (US)

(73) Assignee: Alcoa Fujikura Limited, Franklin, TN (US)

( * ) Notice: Subject to any disclaimer, the term of this patent is extended or adjusted under 35 U.S.C. 154(b) by 0 days.

(21) Appl. No.: 10/040,015

(22) Filed: Oct. 26, 2001

(51) Int. Cl.[7] .............................................. H01R 12/00
(52) U.S. Cl. ..................................................... 439/76.2
(58) Field of Search ............................... 439/76.2, 949

(56) References Cited

U.S. PATENT DOCUMENTS 5,478,244 A * 12/1995 Maue et al. ................ 361/752
5,902,138 A * 5/1999 Murakami .................. 439/76.2
6,008,982 A * 12/1999 Smith ........................ 174/52.1

\* cited by examiner

Primary Examiner—Tulsidas Patel
(74) Attorney, Agent, or Firm—Tracey D. Beiriger

(57) ABSTRACT

A power distribution assembly for distributing a high current electrical input to a plurality of individual and varied current outputs. A lower housing has a plurality of integrally formed socket receptacle defined therein, a corresponding and assembleable upper housing including a plurality of receptacles and establishing an enclosed interior. First and second busbars each include a planar base portion and a plurality of extending terminal pin portions communicable with the receptacle portions of said upper housing. The planar base portions being arranged on opposite faces of a planar shaped and flexible circuit sheet and fastenably engaging, in sandwiching and electrically communicating fashion, to the opposite faces of the circuit sheet. Individual pluralities of first, second and third terminal output pins electrically communicate with the circuit sheet and access selected locations through the upper and lower housings so that, upon the high input current being routed through the busbars and the circuit sheet, the terminal output pins communicate an associated and stepped down output current to specified receptacles.

21 Claims, 5 Drawing Sheets

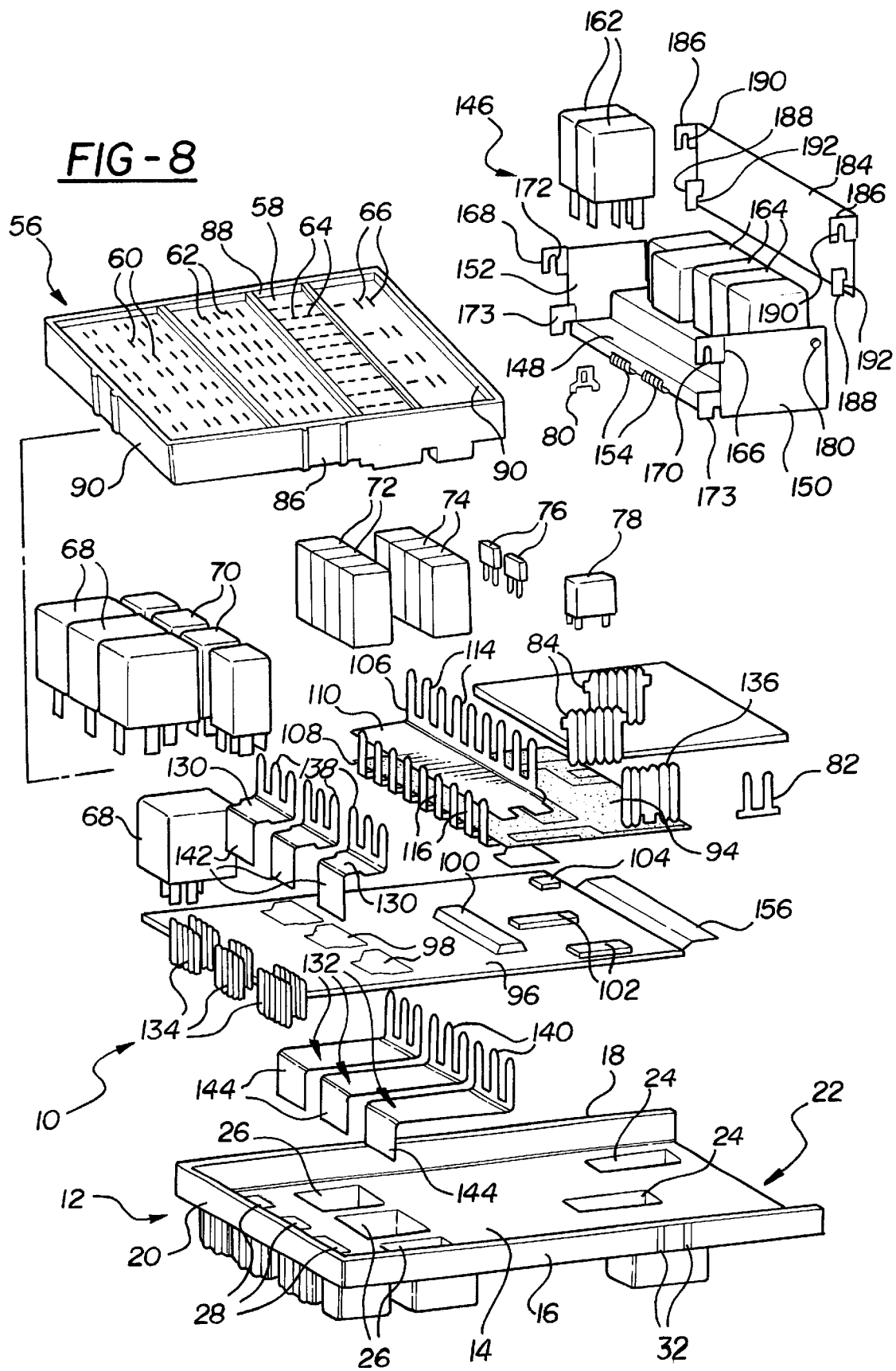

INTEGRATED AND FLEXIBLE POWER DISTRIBUTION ASSEMBLY

FIELD OF THE INVENTION

The present invention relates generally to power distribution, or junction box, assemblies. More particularly, the present invention teaches an improved power distribution assembly, particularly for use with a vehicle, in which high current input is distributed to both high and low current applications. The power distribution assembly is further expandable by the addition of an option end module and in order to increase the capacity of the system for higher end applications.

BACKGROUND OF THE INVENTION

Existing power distribution systems and assemblies (or junction box assemblies) are known in the art, in particular those which employ a relatively few number of electrical bussing components necessary in inputting a high current load (such as originating from the vehicle electrical source) and stepping that current down to necessary output levels for subsequent application to various electrical components through a vehicle. Additional components of existing distribution assemblies include metal stamped frets, intentionally oversized to overcome the manufacturing and processing limitations of the metal stamped frets in the assembly process.

Printed circuit boards employed in the junction box assemblies often require increased circuit trace width or trace thickness (such as accomplished by increased plating thickness) in order to accomplish the higher current carrying capability demanded by the assembly, the result of which being an increase in the cost of the circuit board and/or the reduction in the number of circuits which can occupy the space available on the circuit board. Additionally, such existing assemblies exhibiting molded interconnect devices are limited to low and medium current applications. This is because, in order to apply the technology to high current applications, the circuits must be increased in cross sectional area, again compromising the number of such circuits which can occupy the area made available in the circuit board of the assembly.

Referring to the prior patent art, a first example of an electrical connection box is illustrated in U.S. Pat. No. 5,742,005, issued to Saka et al., and which teaches a first common circuitry component and a second specialty circuitry component. The common circuitry includes flat busbars, whereas the specialty circuitry includes a wire, longitudinal busbars or a flat circuit such as a flexible printed circuit or printed circuit board. A conductive layer is provided on which the common circuitry is formed, as is an additional conductive layer on which is provided the specialty circuitry. The circuitry components are arranged on over the other at different levels within a casing of the electrical connection box.

U.S. Pat. No. 5,703,757, issued to Hayes et al., teaches a junction box for motor vehicles in which first and second housing portions are provided for receiving and containing, respectively, low and high electrical current circuit boards. The housing portions extend in a generally common plane when connected together in order to form a housing unit. A planar insulating panel member containing buses and integral insulation displacement terminals is located between the housing portions and in a plane generally perpendicular to the common plane of the housing portions. The first and second housing portions are abutted and fastened together on opposed sides of the panel member with the buses and integral insulation displacement terminals. The displacement terminals are effective to directly receive insulated wires of an electrical harness and electrically connect the same to the buses and to circuits of and electrical components associated with the circuit boards.

U.S. Pat. No. 5,764,487, issued to Natsume, teaches an electrical junction block for an automotive vehicle having a housing containing a planar busbar and printed circuit board, these components being maintained in parallel and electrically insulated relationship to one another. Receptacles formed on the exterior surfaces of the housing receive mating electrical components such as fuses, relays and wiring harness connectors. Electrical connection between the printed circuit board and the electrical components is accomplished via a plurality of printed circuit boards oriented toward the busbar and second ends which pass through holes in the busbar and then through apertures in the housing and into the receptacles. Each printed circuit board connection terminal additionally includes spacer plates which maintain the printed circuit board in busbar a desired spaced distance, as well as a spring portion which makes electrical contact with the printed circuit board, deflecting slightly when the spacer plates are urged into contact with the printed circuit board.

Kasai, U.S. Pat. No. 6,116,916, teaches another variant of an electrical connection box incorporating a busbar and a printed circuit board, in turn having electronic devices mounted thereon and provided as internal circuits in a casing of the connection box. Terminals provided in the busbar are inserted through the printed circuit board to be secured to a conductive portion by solder for accomplishing a direct electrical connection.

Finally, U.S. Pat. No. 5,434,749, issued to Nakayama, teaches a hybrid printed circuit board for permitting connection between large and small current circuit conductors. An insulating substrate of synthetic resin is provided, having fixing bosses erected thereupon. A flexible printed circuit sheet is provided having small current circuit conductors and busbars as large current circuit conductors. The flexible printed circuit sheet is stacked and arranged on the insulating substrate so that the fixing bosses erected on the insulating substrate pass through and above the flexible printed circuit sheet. The busbars, as large current circuit conductors, are put in contact with the small current circuit conductors and the fixing bosses are heated and deformed to fix the busbars in place.

SUMMARY OF THE INVENTION

The present invention discloses an improved power distribution assembly, particularly for use with a vehicle, in which high current input is distributed to both high and low current applications. Among the numerous advantages and improvements provided by the power distribution assembly are included the flexibility to modify the electrical circuitry quickly and cost effectively, as well as easily adapting the assembly to multiple vehicle applications and to easily add on or interchange attachable electronic components.

Additional advantages include the ability to provide add on option content when required, such as is made possible by the addition of the option end module to increase the capacity of the system for higher end applications. Yet additional features include high and low current fuse protection and circuit splicing, provision of greater circuit density in a given area, and provision of multiple circuit bussing technologies best suited for individual applications within the unit and to provide reduced size and weight.

A housing of the assembly may be provided in a number of different configuration, on preferred arrangement including a lower housing and an engageable upper housing. The lower housing includes first, second and third pluralities of integrally formed socket portions, for receiving associated wire harness plugs, and corresponds to three differently sized and associated pluralities of male terminal output pins. External surfaces of the lower housing are further configured for receiving one or more spacing and mounting feet and in order to secure the housing assembly at any of a number of different mounting arrangements within or against a side wall of the vehicle engine compartment. The upper housing includes additional receptacle portions to communicate with opposite extending portions of each of the differently sized male terminal output pins and further provides for the attachment of existing electrical components include fuses, relays additional wire harness and the like.

A pair of high current upper and lower fuse busbars are provided and are engaged in electrically communicable fashion, such as by riveting, in sandwiching fashion and against opposite sides of a flexible circuit sheet, in turn typically wrapped about an insulating backing. Mini fuses, typically among those engageable with the upper housing, separately communicate with the upper and lower busbars through the flex circuit sheet and in order to step down and distribute the high current input (typically inputted from the vehicle electrical system).

The first, second and third pluralities of male output pins each again include oppositely extending upper and lower frets (or male pins), corresponding to the associated socket or receptacle portions of the lower and upper housings. The differently sized male output pins intercommunicate with the distribution side of the busbars, through the flexible sheet, and provide respective bussing levels (typically high, medium and low output current loads) for individual applications. In one preferred variant, the pluralities of output pins are provided in sizes of 6.3 mm, 2.8 mm and 1.5 mm, each corresponding to a different output current.

As also previously described, the add-on end module is easily engaged in both communicating fashion to the flex circuit and in secure mounting fashion to the assembled housing. In particular, the end module includes configured attachment portions for engaging an associated open side of the housing; an integrally molded flex circuit terminal of the end module pinching an electrically communicating end of the flex circuit against a corresponding flex circuit support within the lower housing. The end modules includes additional receptacle portions defined therein and for accommodating additional load outputs corresponding to yet additional terminal outputs associated with the end module. The power distribution assembly junction box) of the present invention is further configured for use either with or without the add-on end module and this is further facilitated by an attachable end plate, engageable over the open and exposed side of the main housing or, in the event the end (add on) module is engaged, over a corresponding open facing side of the end module.

BRIEF DESCRIPTION OF THE DRAWINGS

FIG. 8 is an overall exploded view of the power distribution assembly and illustrating the upper and lower housing portions, busbars and flexible circuit sheet, differently sized terminal output pins, fuses and relays, and add-on end module according to the present invention.

DETAILED DESCRIPTION OF PREFERRED EMBODIMENTS

Referring now to the several drawing illustrations, in particular the exploded overall illustration of FIG. 8, a power distribution assembly is illustrated at 10 for distributing a high current electrical input as a plurality of individual, and selectively stepped down, current outputs for varied applications in a vehicle.

As previously described, the power distribution assembly provides the flexibility to modify the electrical circuitry quickly and cost effectively, as well as easily adapting the assembly to multiple vehicle applications and to easily add on or interchange attachable electronic components. Additionally, the ability to provide add on option content, such as is made possible by the addition of the end module, increases the capacity of a standardized base system to be quickly and inexpensively upgraded for higher end applications. Yet additional features previously discussed include high and low current fuse protection and circuit splicing, provision of greater circuit density in a given area, and provision of multiple circuit bussing technologies best suited for individual applications within the unit and which contribute to provide reduced size and weight.

Figure 1:
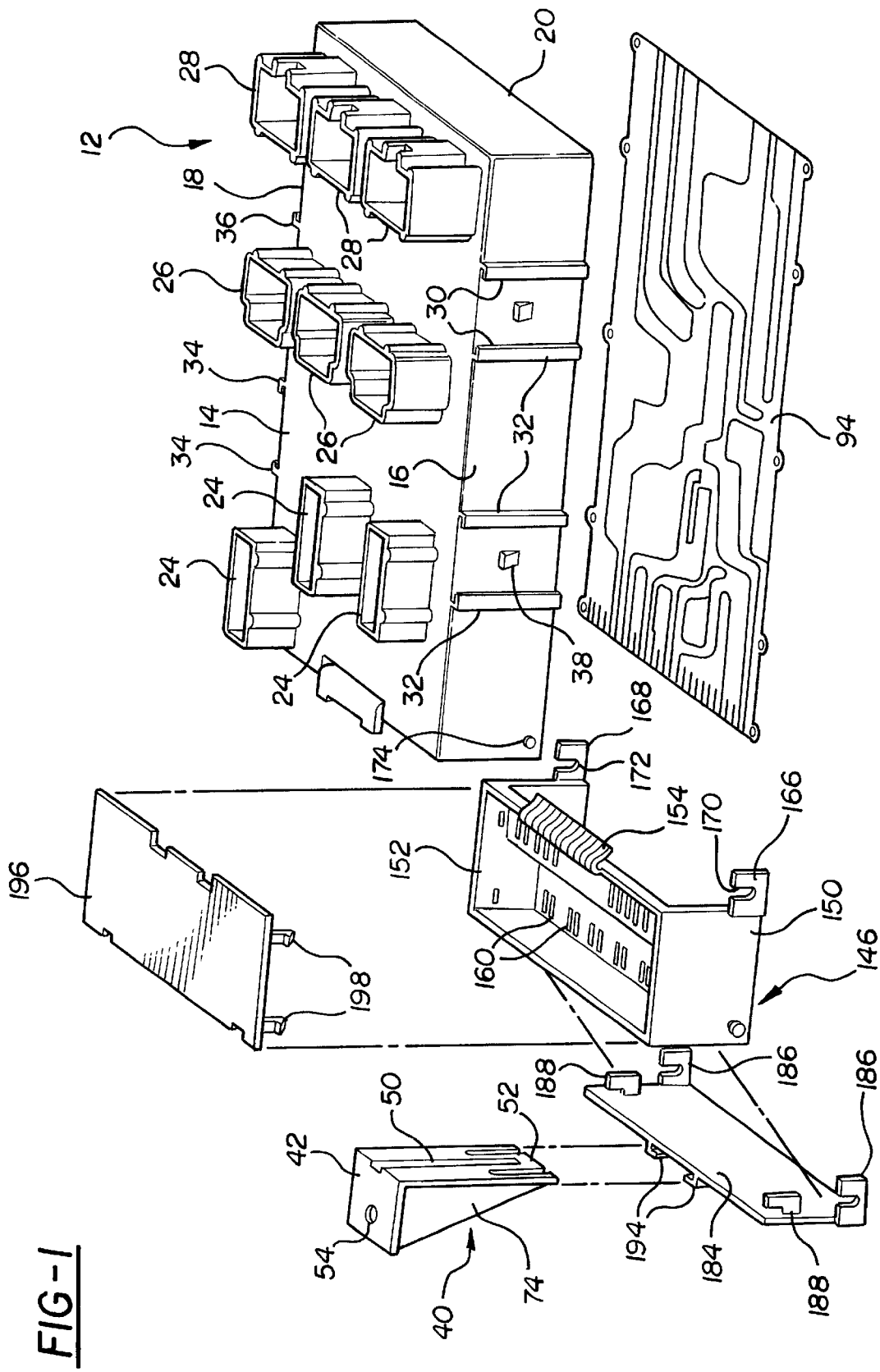
FIG. 1 is an exploded view in perspective of components of the power distribution assembly including the lower housing, flexible circuit sheet, and add-on end module according to the present invention.

Referring again to FIG. 8, as well as to the inverted and exploded subassembly of FIG. 1, a lower housing 12 is illustrated, typically constructed of a durable and hardened plastic material, and which includes a base surface 14, from which extend sides 16 and 18 and a single end 20. The lower housing 12 further includes an open end 22 (defined between the base 14 and ends of the sides 16 and 18 extending opposite from the other end 20) and, within the base 14, pluralities of first 24, second 26 and third 28 socket receptacles. The individually sized pluralities 24, 26 and 28 of the socket receptacles are appropriate for receiving, in engaging fashion, associating socket inserting ends of multiple sized wire harness assemblies. It is also contemplated that the individual socket receptacles 24, 26 and 28 are intentionally sized to accept only a given sized wire harness socket and in order to prevent inadvertent damage to the system or user.

Figure 4:
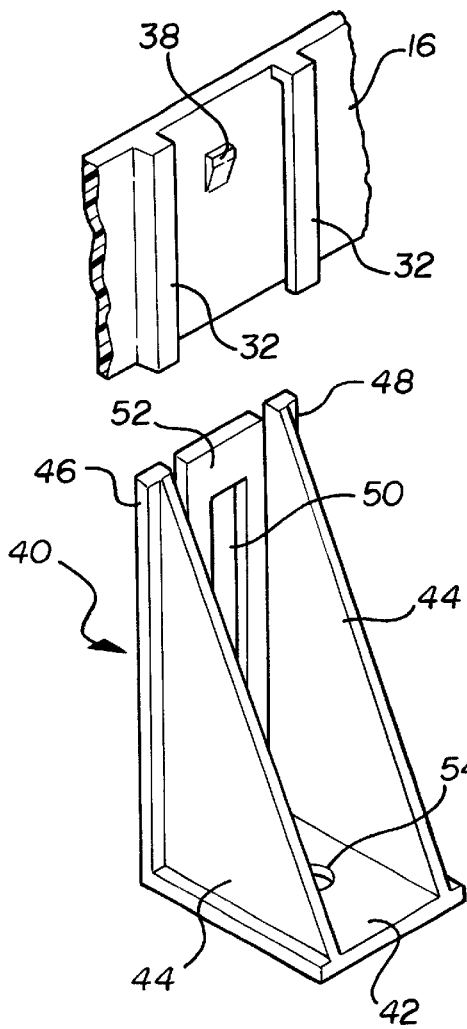
FIG. 4 is a sectional exploded view of a selected mounting foot, such as that shown in FIGS. 1 and 3, and illustrating the manner in which the mounting foot is slidably engaged between guiding projections extending from a selected exterior location of the assembly housing.

Also illustrated at selected exterior locations of the sides 16 and 18 (see at 30, 32, 34, and 36) are spaced apart and opposingly facing/guiding projections. As is also illustrated in the sectional view of FIG. 4, a further tab projection 38 may extend from the selected exterior surface (see again at 16) and between any of the associated pairs (see again by example at 32) of guiding projections.

Each of a number of mounting feet (see by example at 40 in FIG. 4) includes a planar mounting surface 42 and an upwardly extending pedestal (see reinforcing portions 44) with oppositely facing tab projections 46 and 48. The tab projections 46 and 48 slidably engage between and along the spaced apart and inwardly facing guiding projections 32 until such time as the further tab projection 38 snaps into engaging fashion within a slot 50 defined in an upwardly extending surface 52 (forming a further portion of the pedestal) and abutting against the corresponding edges surface of the lower housing 12. Also illustrated at 54 is an aperture defined in the planar mounting surface 42 and, given any number of feet supports 40 (typically three or four) utilized with the assembly, enables the housing to be secured in any appropriate arrangement or location within or along the vehicle's interior or engine compartment (not shown). The ability to space each of the mounting feet a given and incremental degree relative to the housing further avoids the necessity of having to redesign the entire housing structure in order to position it in a desired mounting arrangement.

Referring again to FIG. 8, an upper housing 56 is illustrated generally in phantom and includes primarily a base surface 58 through which is defined, in specified zones, individual pluralities of receptacle portions, e.g., 60, 62, 64, 66, etc., for receiving, in insertingly engaging fashion, such common electrical components, as fuses, relays, resistors, diodes, switches and bi-directional female terminals. Illustrated examples of such components, selected from the above group, are illustrated by relays 68 and 70, busbar (high current) fuses 72, 74, and 76, bi-directional female terminal 80, jumper terminals 82 and PCB (printed circuit board) relays 84. Without limitation, additional types of electrical components may be engaged with selected ones of any given plurality of receptacle portions 60, 62, 64, 66, etc., and it is further envisioned that, in certain instances, wire harness connectors may also engage the upper housing (although not indicated by the preferred embodiment). The upper housing 56, as best illustrated, may further include sides 86 and 88 and interconnecting ends 90 and 92 of given dimension and to facilitate engagement of the housing 56 over the open end of the lower housing 12 (through the use of any conventional types of fasteners or a simplified "snap-fit" engagement) to establish an enclosing interior for housing the various components of the assembly, as will now be described.

Figure 5A:
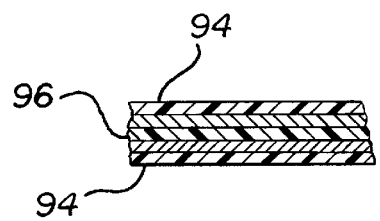
FIG. 5a is a cutaway view taken along line 5a—5a in FIG. 5 and illustrating the flexible circuit sheet wrapped around a plastic insulating layer.
Figure 5:
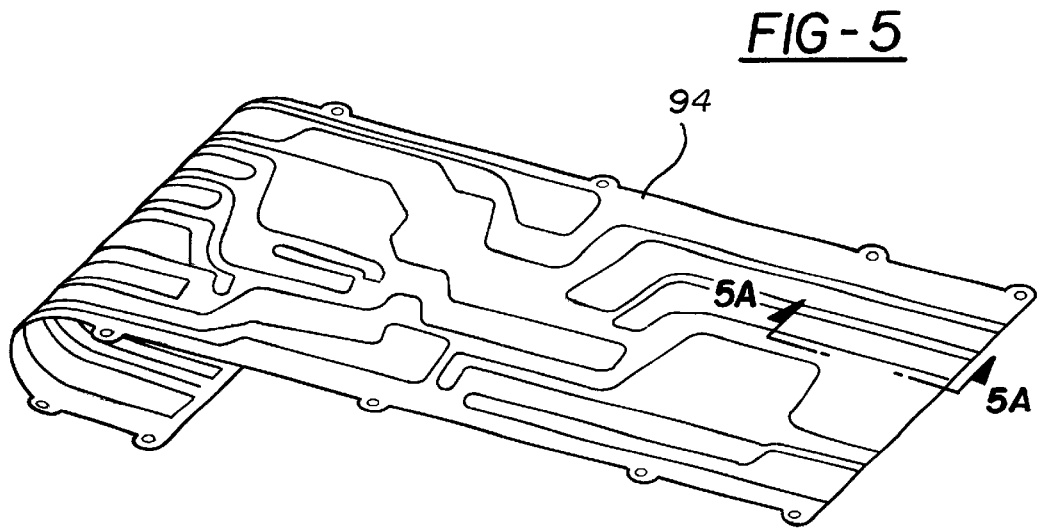
FIG. 5 is an illustration of a flexible circuit sheet.

A flexible circuit sheet 94, such being by itself known in the art, is included. The circuit sheet 94, as is known, contains a number of individual circuit (solder) patterns and provides a degree of flexibility within the overall assembly 10, while at the same time providing higher circuit density capability and eliminating the need for bent blade allowances in the circuit design. Also provided is a single insulating layer 96 (see again FIG. 8 and cutaway FIG. 5a—5a) which provides a medium to wrap the flex circuit sheet 94 thereabout and to further integrate many features required to support and electrically isolate the individual components within the assembled housing. As best again illustrated in FIG. 8, the insulating layer 96 is typically a plasticized, substantially rigid planar shaped element and may include appropriately formed apertures 98, 100, 102 and 104 defined therethrough and which, with reference to the further explanation below, permits the flex circuit sheet 94 to communicate with the pluralities of socket receptacles 24, 26 and 28 defined in the lower housing 12.

Figure 6:
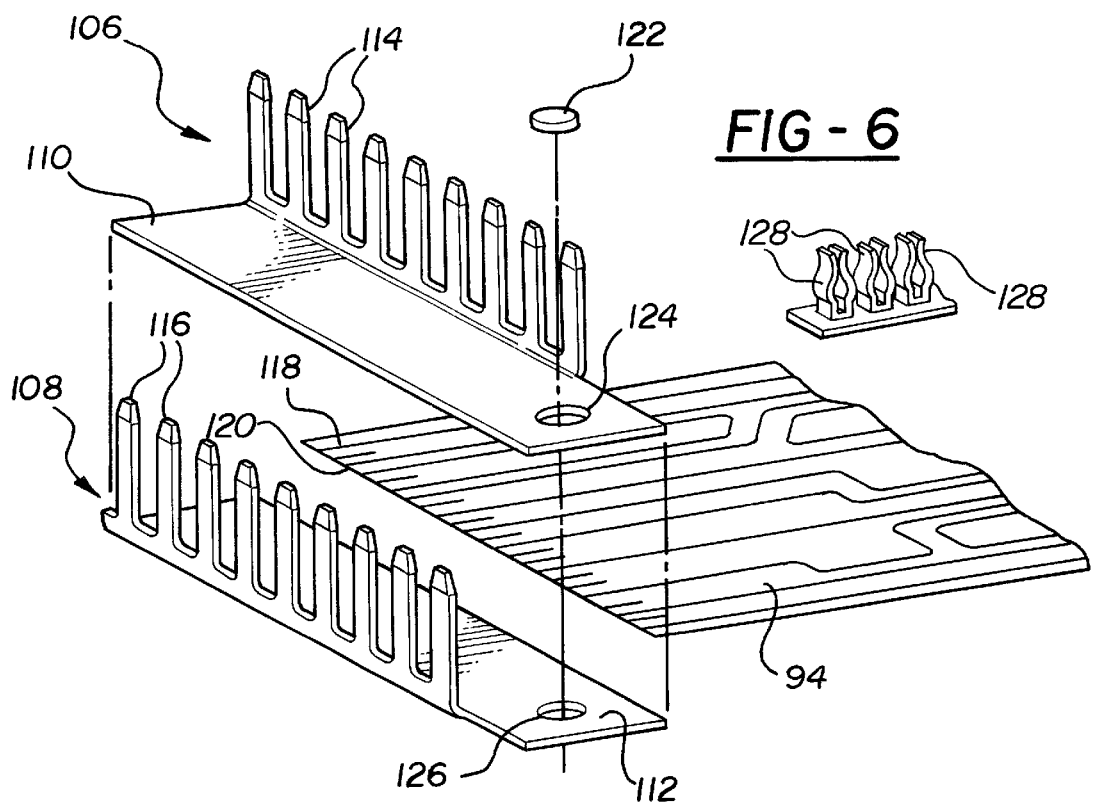
FIG. 6 is an exploded view of the upper and lower busbars arranged on opposite sides of the flexible circuit sheet.
Figure 7:
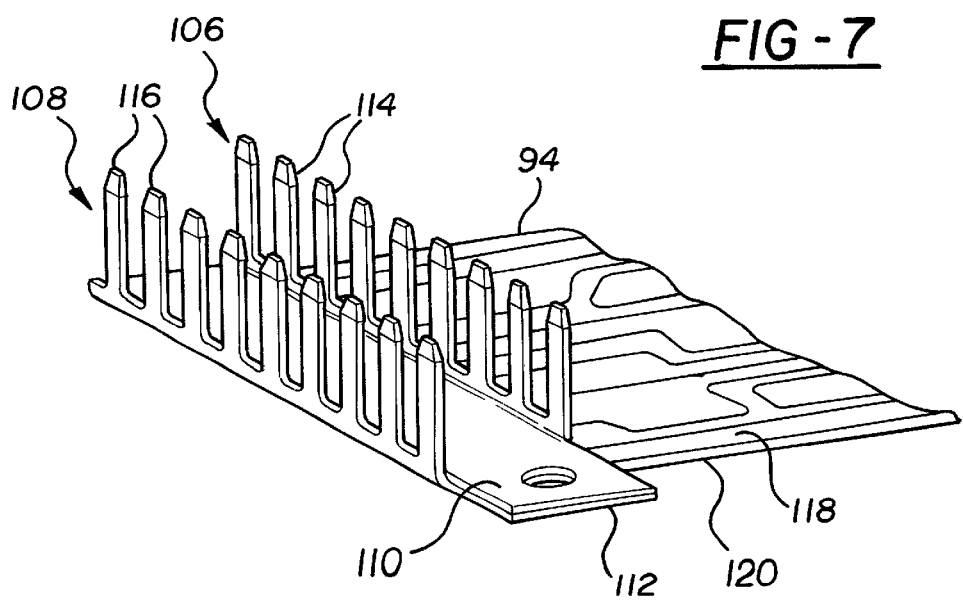
FIG. 7 is an assembled view of the busbars secured in electrically communicable and riveted fashion and in order to sandwich therebetween the flexible circuit sheet.

Referring now to FIGS. 6 and 7, as well as again to FIG. 8, a pair of busbars 106 and 108 (such as Jcase busbars) are provided, each including a planar base portion (see at 110 and 112, respectively) and pluralities (114 and 116) of extending terminal pin portions. As best illustrated by the exploded view of FIG. 6, the planar base portions 110 and 112 are arranged on opposite faces 118 and 120 of the flexible circuit sheet 94. Upon fastenably engaging, in sandwiching and electrically communicating fashion, to the opposite faces 118 and 120 of the flex circuit sheet 94, the first (upper) 106 and second (lower 108) busbars are arranged in electrically communicating fashion both to each other and to the flex sheet 94 and provide a conduit by which the high current electrical input is received, bussed (selectively stepped down or, in some instances maintained) and redistributed to the various current outputs in the assembly.

Along these lines, the fuses previously identified at 68, 70, 72 and 74 may engage with terminal pin portions 114 and 116 extending through associated receptacle portions (such as at 60 and 62) defined in the upper assembleable housing. It is also contemplated that the busbars 106 and 108 may be constructed of hermaphroditic metal stampings and which are secured in toggleocked fashion about the circuit sheet 94 by rivets 122 securing through apertures 124 and 126 (see FIG. 6). Additionally, mini-fuses are illustrated at 128 in FIG. 6 and are specifically provided to separately communicate with the busbars 106 and 108, through the flex circuit 94.

Referring once again to FIG. 8, and upon the input current being stepped down on an output/distributed side (again by virtue of the busbars 106 and 108 and associated fuses 68, 70, 72 and 74), individual pluralities of first, second and third terminal output pins are provided for feeding the distributed current (typically in associated high, medium and low current ratings) to the socket receptacles 24, 26, and 28 in the lower housing 12. In particular, the terminal output pins further include first pluralities of 6.3 mm upper 130 and lower 132 frets, second pluralities 134 of 2.8 mm male terminal pins and third pluralities 136 of 1.5 mm terminal header pins.

Each of the pluralities of terminal output pins 130 and 132, 134 and 136 extending in associating and communicating fashion with both selected receptacle portions (e.g. 60, 62, 64, 66, e.g.) defined in the upper housing 56, as well as selected socket receptacles 24, 26 and 28 in the lower housing 12. In particular, upper frets 130 include extending pins 138 and lower frets 132 associating pins 140 for electrically communicating with selected receptacle portions of the upper housing 56. Opposite blade portions, 142 and 144, respectively, extend from the upper and lower frets 130 and 132 and likewise electrically communicate with selected socket receptacles (again 24, 26 and 28).

Having described the above standard assembly, it is contemplated that the present invention provides a standardized junction box for placement in most vehicles and which is adequate for the current routing and distribution requirements. In certain applications, it has been found that some additional bussing capacity is needed (such as for larger sized trucks, sport utility and luxury vehicles) and beyond that necessary for the majority of applications. Accordingly, and rather than providing as a standard unit, an over-capacity junction box (with the attendant higher costs), it is preferable to engage an optional add-on end module to the distribution assembly and an example of such is illustrated at 146 in varied applications as will now be described.

Figure 2:
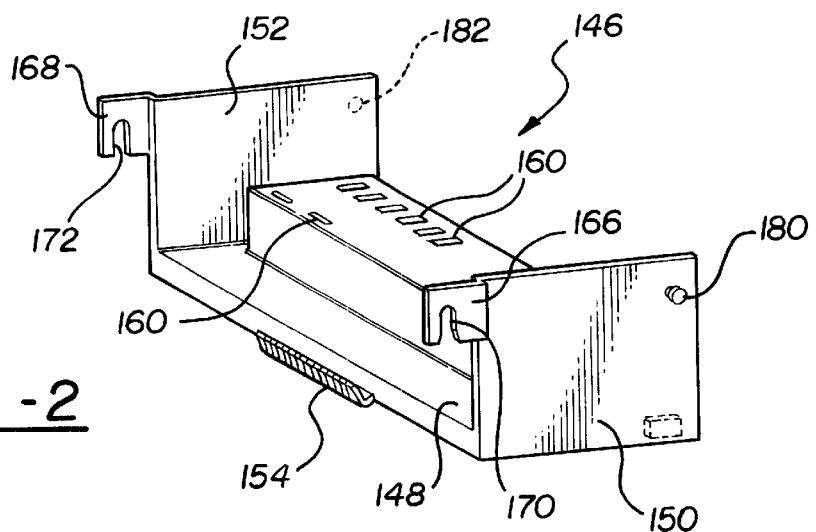
FIG. 2 is a sectional view of the add-on module, also illustrated in FIG. 1., according a further and rotated perspective, and better illustrating both the extending attachment portions for structurally securing to the lower housing unit, as well the integrally molded and flexible circuit terminal.

As best shown in the sectional view of FIG. 2, the add-on end module 146 is likewise constructed of a plasticized material and includes a base 148 with first 150 and second 152 upwardly extending end walls. An integrally molded and flexible circuit terminal 154 extends from an edge of the base 148. Referring further to the cutaway of FIG. 3, and upon engaging against the open end 22 of the lower housing 12 in electrically communicating and structurally engageable fashion, the integrally molded and flexible circuit terminal 154 biasingly engages a corresponding edge 156 of said flexible circuit sheet 94.

Figure 3:
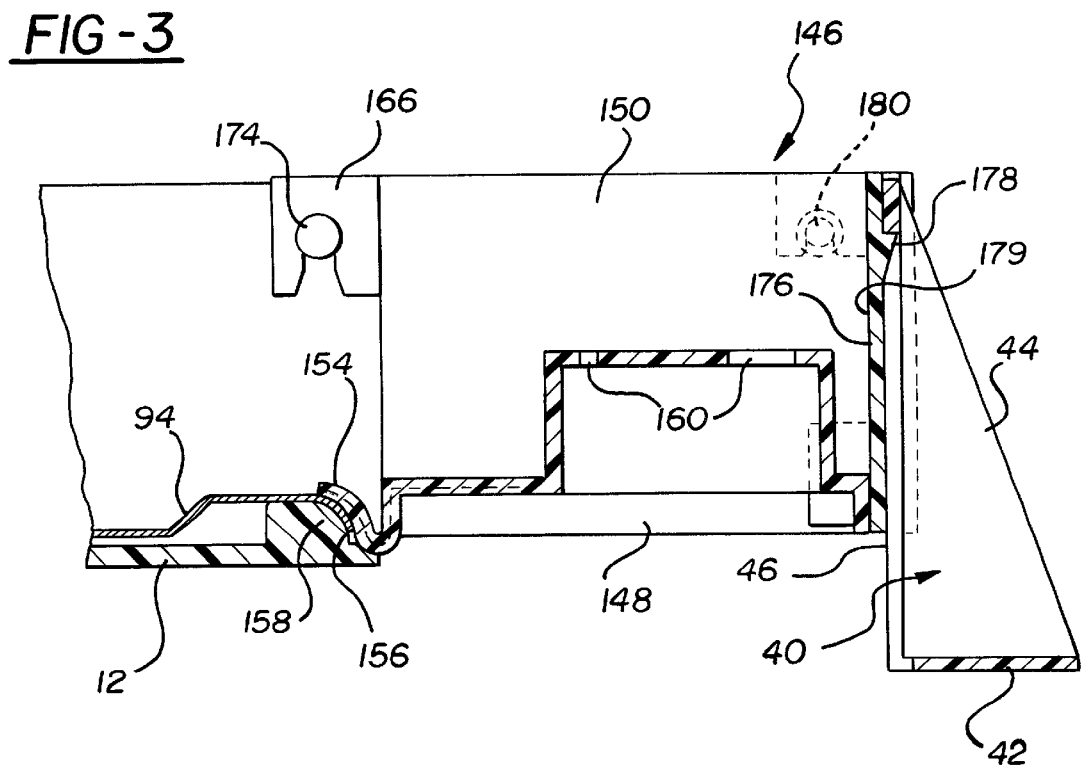
FIG. 3 is a side view in cutaway and which illustrates the engagement of end module with the main housing along one edge, as well as an engageable spacing and mounting foot secured to an opposite exterior edge of the end module.

A base surface of the lower housing 12 further comprising an arcuate edge support surface 158 for facilitating biasing engagement between the flexible circuit terminal 156 of the end module 154 and the corresponding edge 156 of the flex circuit sheet 94. A plurality of female terminals 160 are integrally molded upon the end module 146 and, as best shown in the side cutaway of FIG. 3, are electrically communicable with the flex circuit sheet 94 and biasing terminal 154. As further illustrated by the applicational view of FIG. 8, the integrally formed female terminals 160 receive, in engaging fashion, additional known components such as pluralities of relays 162 and 164 (illustrated), as well other known components including again fuses, diodes, etc., and in order to provide the necessary bussing capacity contributed by the end module 146 to the overall power distribution assembly. In particular, such additional features may include smart functions such as bulb monitoring, outage indication circuits, as well as timed outputs for loads such as intermittent wiper and one touch down windows.

The end module 146 further includes tabs 166 and 168 extending from a selected forward edge of each of end walls 150 and 152. Further defined in each of the tabs 166 and 168 is a recessed channel (see at 170 and 172, etc.) extending from an underside edge location. Additional and optional tabs 173 (see FIG. 8) may extend from lower locations of the end module and also include underside extending channels for securing to further locations of the lower housing 12 (not shown).

Corresponding annular projections extending from proximate edge locations of the lower housing 12 (a first 174 of the annular projections being shown in FIGS. 1 and 3 with a second opposite projection hidden from view) and engage within the recessed channels 170 and 172, respectively. Referring again to FIG. 3, a mounting foot, again generally illustrated at 40, may be secured in the fashion previously described between an additional pair of spaced apart and guiding projections (see in side illustration at 176) and a further tab projection 178. An end wall 179 (from which the guiding projections 176 and tab projection 178 extends) may in certain instances form a fixed portion of the end module or, as will be subsequently described, a removable portion.

The end module 146 includes annular projections at 180 and at 182 (see FIG. 2) extending from locations proximate rearward edges of the end walls 150 and 152. A planar shaped end gate 184 is provided and includes upper 186 and lower 188 tabs extending from opposite side edges, each of the tabs 186 and 188 again further including a recessed channel (190 and 192, respectively) extending from an underside edge location and facilitating engagement by said annular projections of said end module to secure said end gate thereto. Referring again to FIG. 1, another mounting foot, again generally illustrated at 40, may be secured in the fashion previously described between an yet further pair of spaced apart and guiding projections 194 (see in side illustration at 176) arranged on an exterior surface of the attachable end gate 184. Referring again to FIG. 1, an attachable top (or bottom depending upon perspective) cap 196 is dimensioned to configure with the open top of the end module 146, and includes downwardly extending tabs 198 which and which biasingly engages the cap 196 over the end module.

It is also envisioned that the present assembly may be produced as a standardized unit so that, in the event the end module 146 is not required, the end gate 184 may be directly attached to the open end 22 of the lower housing 12 to enclose the housing. In this variant, the tabs 186 and 188 of the end gate 184 substitute those illustrated at 166 and 168 (as well as 173 in the variant of FIG. 8) and secure directly to the annular projections (see again at 174) defined along the edge of the lower housing 12.

Having described our invention, it is evident that the power distribution assembly provides an improved junction box incorporating reductions in weight and size. The assembly also permits quick turn around time for electrical design changes with a minimal of tooling costs.

Having described the presently preferred embodiments, it is to be understood that the invention may be otherwise embodied within the scope of the appended claims.

What is claimed is:

1. A power distribution assembly for distributing a high current electrical input to a plurality of individual and varied current outputs, said assembly comprising:

a housing;

a first metal stamped busbar and a second metal stamped busbar, each of said busbars including a planar base portion and a plurality of extending terminal output pin said planar base portions being secured in togglelocked fashion on opposite faces of a planar shaped circuit sheet and fastenably engaging, in sandwiching and electrically communicating fashion, to said opposite faces of said circuit sheet; and at least one of said plurality of terminal output pins electrically communicable with said circuit sheet and accessible at selected locations through said housing so that, upon the high input current being routed through said busbars and said circuit sheet, said terminal output pins communicate the associated output current to said selected locations.

2. The power distribution assembly as described in claim 1, said circuit sheet further comprising a plasticized flexible circuit sheet wrapped around a substantially rigid insulating layer.

3. The power distribution assembly as described in claim 2, said terminal output pins further comprising a first plurality of high current output pins, a second plurality of medium current output pins, and a third plurality of low current output pins.

4. The power distribution assembly as described in claim 3, said terminal output pins further comprising a first plurality of 6.3 mm upper and lower frets, a second plurality of 2.8 mm male terminal pins and a third plurality of 1.5 mm terminal header pins.

5. The power distribution assembly as described in claim 1, further comprising said busbars being secured in engaging fashion about said circuit sheet by fastening means including, without limitation, togglelock rivets.

6. The power distribution assembly as described in claim 3, said housing further comprising:
   a lower housing having first, second and third integrally formed socket receptacles defined in a surface thereof and for communicating said terminal output pins with externally engageable wire harnesses;
   an upper housing having a plurality of receptacle portions defined through a face thereof suitable for receiving, in engaging fashion, electrical components selected from the group including fuses, relays, resistors, diodes, switches and bi-directional female terminals; and
   said upper and lower housings each defining three dimensional enclosures with oppositely facing open sides capable of being assembled together to enclose, therebetween, said busbars, flexible circuit sheet and plurality of terminal output pins.

7. The power distribution assembly as described in claim 6, selected exterior surfaces of at least one of said upper and lower housings further comprising spaced apart and guiding projections, a plurality of mounting feet each including a planar mounting surface and an upwardly extending pedestal with oppositely facing tab projections slidably and fastenably engaged between a selected pair of guiding projections.

8. The power distribution assembly as described in claim 6, said lower housing further comprising an open end suitable for receiving, in electrically communicating and structurally engageable fashion, an add-on end module.

9. The power distribution assembly as described in claim 8, said end module further comprising a base with first and second upwardly extending end walls, an integrally molded and flexible circuit terminal extending from an edge of said base and biasingly engaging, upon attaching said end module to said lower housing, a corresponding edge of said flexible circuit sheet.

10. The power distribution assembly as described in claim 9, said end module further comprising tabs extending from a selected forward edge of each of said end walls, each of said tabs including a recessed channel extending from an underside edge location, corresponding annular projections extending from proximate edge locations of said lower housing and engaging within said recessed channels.

11. The power distribution assembly as described in claim 9, further comprising a plurality of female terminals integrally molded upon said end module base.

12. The power distribution assembly as described in claim 9, a base surface of said lower housing further comprising an accurate edge support surface for facilitating biasing engagement between said flexible circuit terminal of said end module and said flex circuit sheet.

13. The power distribution assembly as described in claim 11, further comprising a plurality of relays engaged in electrically communicating fashion with said female terminals.

14. The power distribution assembly as described in claim 6, said lower housing further comprising an open end suitable for receiving, in enclosing fashion, a substantially planar shaped end gate.

15. The power distribution assembly as described in claim 14, further comprising upper and lower tabs extending from side edges of said end gate, each of said tabs including a recessed channel extending from an underside edge location, corresponding annular projections extending from proximate edge locations of said lower housing and engaging within said recessed channels.

16. The power distribution assembly as described in claim 10, further comprising annular projections extending from locations proximate rearward edges of said end walls of said engaged end module, a planar shaped end gate being provided and including upper and lower tabs extending from opposite side edges, each of said tabs further including a recessed channel extending from an underside edge location and facilitating engagement by said annular projections of said end module to secure said end gate thereto.

17. The power distribution assembly as described in claim 14, said end gate further comprising a pair of spaced apart and guiding projections defined on an exterior surface thereof, a mounting foot including a planar mounting surface and an upwardly extending pedestal with oppositely facing tab projections slidably and fastenably engaged between said pair of guiding projections.

18. A power distribution assembly for distributing a high current electrical input to a plurality of individual and varied current outputs, said assembly comprising:
   a lower housing having a plurality of integrally formed socket receptacles defined therein, an upper housing assembleable with said lower housing to define a substantially enclosed interior, said upper housing including a plurality of receptacle portions defined through a face thereof suitable for receiving, in engaging fashion, electrical components selected from the group including fuses, relays, resistors, diodes, switches and bi-directional female terminals;
   selected exterior surfaces of at least one of said upper and lower housings further comprising spaced apart and guiding projections, a plurality of mounting feet each including a planar mounting surface and an upwardly extending pedestal with oppositely facing tab projections slidably and fastenably engaged between a selected pair of guiding projections;
   a first busbar and a second busbar, each of said busbars including a planar base portion and a plurality of extending terminal pin portions communicable with said receptacle portions of said upper housing, said planar base portions being arranged on opposite faces of a planar shaped and flexible circuit sheet and fastenably engaging, in sandwiching and electrically communicating fashion, to said opposite faces of said circuit sheet;
   individual pluralities of first, second and third terminal output pins electrically communicable with said circuit sheet and accessible at selected locations through said upper and lower housings so that, upon the high input current being routed through said busbars and said circuit sheet, said terminal output pins communicated an associated and stepped down output current to specified socket receptacles; and
   said lower housing further comprising an open end suitable for receiving, in electrically communicating and structurally engageable fashion, an add-on end module, said end module further comprising a base with first and second upwardly extending end walls, an integrally molded and flexible circuit terminal extending from an edge of said base and biasingly engaging, upon attaching said end module to said lower housing, a corresponding edge of said flexible circuit sheet.

19. A power distribution assembly for distributing a high current electrical input to a plurality of individual and varied current outputs, said assembly comprising:
   a housing, said housing further comprising:
      a lower housing having first, second and third integrally formed socket receptacles defined in a surface thereof;

an upper housing having a plurality of receptacle portions defined through a face thereof suitable for receiving, in engaging fashion, electrical components including at least one of fuses, relays, resistors, diodes switches and bi-directional female terminals; and said upper and lower housings each defining three dimensional enclosures with oppositely facing open sides capable of being assembled together, selected exterior surfaces of at least one of said upper and lower housings further comprising spaced apart and guiding projections, a plurality of mounting feet each including a planar mounting surface and an upwardly extending pedestal with oppositely facing tab projections slidably and fastenably engaged between a selected pair of guiding projections;

a first busbar and a second busbar, each of said busbars including a planar base portion and a plurality of extending terminal pin portions, said planar base portions being arranged on opposite faces of a planar shaped circuit sheet and fastenably engaging, in sandwiching and electrically communicating fashion, to said opposite faces of said circuit sheet, said circuit sheet further comprising a plasticized flexible circuit sheet wrapped around a substantially rigid insulating layer; and at least one plurality of terminal output pins electrically communicable with said circuit sheet and accessible at selected locations through said housing so that, upon the high input current being routed through said busbars and said circuit sheet, said terminal output pins communicate the associated output current to said selected locations, said upper and lower housings capable of being assembled together to enclose, therebetween, said busbars, flexible circuit sheet and plurality of terminal output pins, said integrally formed socket receptacles in said lower housing communicating said terminal output pins with externally engageable wire harnesses, said terminal output pins further comprising a first plurality of high current output pins, a second plurality of medium current output pins, and a third plurality of low current output pins.

20. A power distribution assembly for distributing a high current electrical input to a plurality of individual and varied current outputs, said assembly comprising:

a housing, said housing further comprising:

a lower housing having first, second and third integrally formed socket receptacles defined in a surface thereof, said lower housing further comprising an open end suitable for receiving, in electrically communicating and structurally engaging fashion, an add-on end module;

an upper housing having a plurality of receptacle portions defined through a face thereof suitable for receiving, in engaging fashion, electrical components including at least one of fuses, relays, resistors, diodes switches and bi-directional female terminals; and said upper and lower housings each defining three dimensional enclosures with oppositely facing open sides capable of being assembled together;

a first busbar and a second busbar, each of said busbars including a planar base portion and a plurality of extending terminal pin portions, said planar base portions being arranged on opposite faces of a planar shaped circuit sheet and fastenably engaging, in sandwiching and electrically communicating fashion, to said opposite faces of said circuit sheet, said circuit sheet further comprising a plasticized flexible circuit sheet wrapped around a substantially rigid insulating layer; and at least one plurality of terminal output pins electrically communicable with said circuit sheet and accessible at selected locations through said housing so that, upon the high input current being routed through said busbars and said circuit sheet, said terminal output pins communicate the associated output current to said selected locations, said upper and lower housings capable of being assembled together to enclose, therebetween, said busbars, flexible circuit sheet and plurality of terminal output pins, said integrally formed socket receptacles in said lower housing communicating said terminal output pins with externally engageable wire harnesses, said terminal output pins further comprising a first plurality of high current output pins, a second plurality of medium current output pins, and a third plurality of low current output pins.

21. A power distribution assembly for distributing a high current electrical input to a plurality of individual and varied current outputs, said assembly comprising:

a housing, said housing further comprising:

a lower housing having first, second and third integrally formed socket receptacles defined in a surface thereof, said lower housing further comprising an open end suitable for receiving, in enclosing fashion, a substantially planar shaped end gate;

an upper housing having a plurality of receptacle portions defined through a face thereof suitable for receiving, in engaging fashion, electrical components including at least one of fuses, relays, resistors, diodes switches and bi-directional female terminals; and said upper and lower housings each defining three dimensional enclosures with oppositely facing open sides capable of being assembled together;

a first busbar and a second busbar, each of said busbars including a planar base portion and a plurality of extending terminal pin portions, said planar base portions being arranged on opposite faces of a planar shaped circuit sheet and fastenably engaging, in sandwiching and electrically communicating fashion, to said opposite faces of said circuit sheet, said circuit sheet further comprising a plasticized flexible circuit sheet wrapped around a substantially rigid insulating layer; and at least one plurality of terminal output pins electrically communicable with said circuit sheet and accessible at selected locations through said housing so that, upon the high input current being routed through said busbars and said circuit sheet, said terminal output pins communicate the associated output current to said selected locations, said upper and lower housings capable of being assembled together to enclose, therebetween, said busbars, flexible circuit sheet and plurality of terminal output pins, said integrally formed socket receptacles in said lower housing communicating said terminal output pins with externally engageable wire harnesses, said terminal output pins further comprising a first plurality of high current output pins, a second plurality of medium current output pins, and a third plurality of low current output pins.

* * * * *